(12) United States Patent
Huang

(10) Patent No.: US 7,928,873 B1
(45) Date of Patent: Apr. 19, 2011

(54) ANALOG-TO-DIGITAL CONVERSION CIRCUIT

(75) Inventor: Chih-Haur Huang, Tainan County (TW)

(73) Assignee: Himax Media Solutions, Inc., Tainan County (TW)

( * ) Notice: Subject to any disclaimer, the term of this patent is extended or adjusted under 35 U.S.C. 154(b) by 0 days.

(21) Appl. No.: 12/637,766

(22) Filed: Dec. 15, 2009

(51) Int. Cl.
*H03M 1/00* (2006.01)
(52) U.S. Cl. .................................. 341/122; 341/155
(58) Field of Classification Search .................. 341/122, 341/120, 155, 156, 161, 172, 121, 118, 119
See application file for complete search history.

(56) References Cited

U.S. PATENT DOCUMENTS
7,808,417 B2 * 10/2010 Nazemi .......................... 341/161
* cited by examiner

*Primary Examiner* — Joseph Lauture
(74) *Attorney, Agent, or Firm* — Jianq Chyun IP Office

(57) ABSTRACT

An analog-to-digital conversion circuit is provided. A voltage divider of the analog-to-digital conversion circuit regulates a voltage range received by a sample holder of analog-to-digital conversion circuit. Accordingly, a first half of the sample holder can use an electrical device with a low operating voltage. Since an operation speed of the electrical device with the low voltage is faster than an electrical device with a high operating voltage, an operation frequency of the sample holder can be raised.

8 Claims, 2 Drawing Sheets

ANALOG-TO-DIGITAL CONVERSION CIRCUIT

BACKGROUND OF THE INVENTION

1. Field of the Invention

The present invention relates to an analog-to-digital conversion circuit. More particularly, the present invention relates to an analog-to-digital conversion circuit that can increase an operation frequency of a sample holder thereof.

2. Description of Related Art

Computers have become indispensable tools in modern life, and most of the information is processed by digital systems. To ensure the digital system can process analog information (for example, temperature, humidity, and luminance, etc.), an analog-to-digital conversion circuit is applied to convert the analog information into digital information.

FIG. 1 is a functional block diagram illustrating a conventional analog-to-digital conversion circuit. Referring to FIG. 1, in the conventional analog-to-digital conversion circuit 100, to satisfy a specification of high input impedance, a source follower 110 serves as an input stage. The source follower 110 receives an input voltage Vin, wherein an input range of the input voltage Vin is, for example, 0-1.5V. Since the source follower 110 has an electrical characteristic of uplifting a voltage for about 1V, an output range of the source follower 110 is about 1-2.5V.

Since the output range of the source follower 110 is about 1-2.5V, a first half of a sample holder 120 has to use an electronic device with an operating voltage of 3.3V to correctly sample the voltages. The sample holder 120 outputs a sampled voltage to an analog-to-digital converter (ADC) 130. The ADC 130 converts the sampled voltage into digital information and provides it to the digital system for processing.

Compared to an electronic device with an operating voltage of 1.8V, an equivalent capacitance of the electronic device with the operating voltage of 3.3V is greater. Moreover, an electron mobility of the electronic device with the operating voltage of 3.3V is lower than that of the electronic device with the operating voltage of 1.8V. Therefore, since the first half of the sample holder 120 uses the electronic device with the operating voltage of 3.3V, an operation frequency of the sample holder 120 is limited.

SUMMARY OF THE INVENTION

The present invention is directed to an analog-to-digital conversion circuit, which can increase an operation frequency of a sample holder.

The present invention provides an analog-to-digital conversion circuit including a first source follower, a voltage divider, a second source follower, a sample holder and an analog-to-digital converter (ADC). The first source follower receives an input voltage. The voltage divided is coupled to the first source follower. The second source follower is coupled to the voltage divider. The sample holder is coupled to the second source follower. The ADC is coupled to the sample holder. Wherein, an operating voltage of the first source follower and the second source follower is a first voltage, and an operating voltage of the sample holder and the ADC is a second voltage, and the second voltage is less than the first voltage.

In an embodiment of the present invention, the first source follower includes a first transistor and a second transistor. A control terminal of the first transistor is coupled to a bias, a first terminal of the first transistor is coupled to the first voltage, and a second terminal of the first transistor is coupled to the voltage divider. A control terminal of the second transistor is coupled to the input voltage, a first terminal of the second transistor is coupled to the second terminal of the first transistor, and a second terminal of the second transistor is coupled to a ground voltage.

In an embodiment of the present invention, the voltage divider includes a first resistor and a second resistor. The first resistor is coupled between the first source follower and the second source follower. The second resistor is coupled between the second source follower and the ground voltage, and is connected to the first resistor in serial.

In an embodiment of the present invention, the second source follower includes a third transistor and a fourth transistor. A control terminal of the third transistor is coupled to the bias, a first terminal of the third transistor is coupled to the first voltage, and a second terminal of the third transistor is coupled to the sample holder. A control terminal of the fourth transistor is coupled to the voltage divider, a first terminal of the fourth transistor is coupled to the second terminal of the third transistor, and a second terminal of the fourth transistor is coupled to the ground voltage.

In an embodiment of the present invention, the sample holder includes an operation amplifier, a first switch, a first capacitor, a second switch, a second capacitor and a third switch. A positive input terminal of the operation amplifier is coupled to the ground voltage. A first terminal of the first switch is coupled to the second source follower. The first capacitor is coupled between another terminal of the first switch and a negative input terminal of the operation amplifier. The second switch is coupled between another terminal of the first switch and the ground voltage. The second capacitor is coupled between the negative input terminal of the operation amplifier and an output terminal of the operation amplifier. The third switch is coupled to the second capacitor in parallel. Wherein, during a first period, the first switch and the third switch are conducted, and the second switch is not conducted. During a second period, the second switch is conducted, and the first switch and the third switch are not conducted.

In an embodiment of the present invention, each of the first switch, the second switch and the third switch is a transistor.

In an embodiment of the present invention, the first voltage is 3.3V, and the second voltage is 1.8V.

In an embodiment of the present invention, the ADC is a pipelined ADC.

In the analog-to-digital conversion circuit of the present invention, the voltage range received by the sample holder is adjusted by the voltage divider, so that the first half of the sample holder can use the electronic device with a low operating voltage. Since an operation speed of the electronic device with the low operating voltage is higher than that of the electronic device with a high operating voltage, the operation frequency of the sample holder can be increased.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
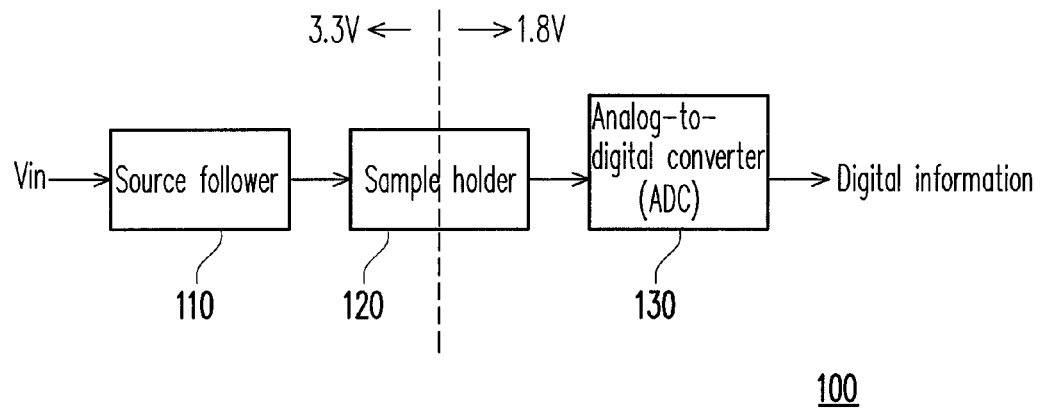
FIG. 1 is a functional block diagram illustrating a conventional analog-to-digital conversion circuit.
Figure 2:
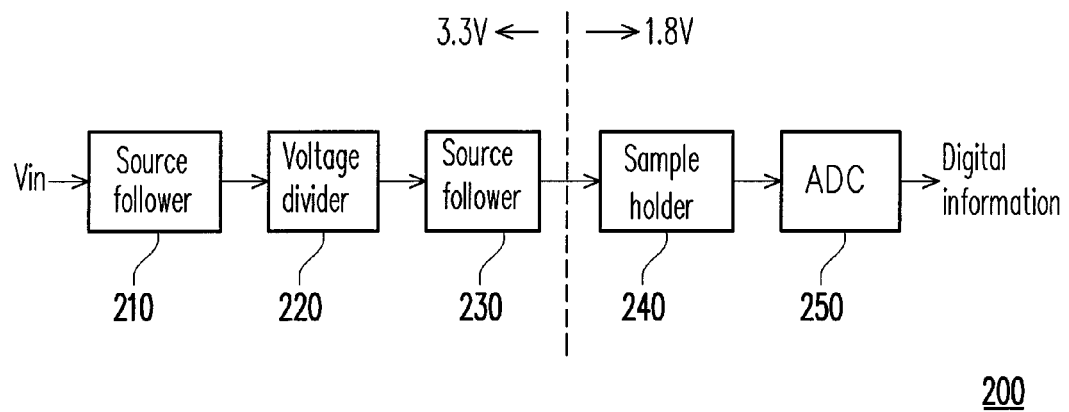
FIG. 2 is a functional block diagram illustrating an analog-to-digital conversion circuit according to an embodiment of the present invention.

FIG. 2 is a functional block diagram illustrating an analog-to-digital conversion circuit according to an embodiment of the present invention. Referring to FIG. 2, the analog-to-digital conversion circuit 200 includes two source followers 210 and 230, a voltage divider 220, a sample holder 240 and an analog-to-digital converter (ADC) 250, wherein the ADC 250 can be a pipelined ADC. The source follower 210 receives an input voltage Vin, and uplifts the input voltage Vin. The voltage divider 220 is coupled to the source follower 210 for dividing the uplifted input voltage Vin, so as to reduce an output voltage range thereof. The source follower 230 is coupled to the voltage divider 220. Since the source follower 230 may uplift the output voltage range of the voltage divider 220, an output voltage range of the source follower 230 is higher than the output voltage range of the voltage divider 220. Moreover, the source follower 230 provides a current to drive the sample holder 240.

The sample holder 240 is coupled to the source follower 230 for sampling a voltage output from the source follower 230. The sample holder 240 outputs a sampled voltage to the ADC 250, and the output voltage is maintained stable during a working period. In the analog-to-digital conversion circuit 200, though the voltage range of the input voltage Vin is uplifted by the source followers 210 and 230, due to a voltage dividing effect of the voltage divider 220, the uplifted voltage range of the input voltage Vin can be reduced, so that the output voltage range of the source follower 230 can be reduced. Since a voltage range of the voltage input to the sample holder 240 can be reduced, a first half of the sample holder 240 is unnecessary to use an electronic device with a high operating voltage (or referred to as a first voltage, for example, 3.3V), but can use an electronic device with a low operating voltage (or referred to as a second voltage, for example, 1.8V). Since an electron mobility of the electronic device with the low operating voltage is higher than that of the electronic device with the high operating voltage, i.e. an operation speed of the electronic device with the low operating voltage is faster, an operation frequency of the sample holder 240 can be increased.

The ADC 250 is coupled to the sample holder 240, and is used for converting the sampled voltage of the sample holder 240 into digital information, wherein the digital information can be provided to a digital system for processing. It should be noticed that if the voltage divider 220 is designed to be capable of providing enough current to drive the sample holder 240, the source follower 230 can be omitted according to a consideration of the circuit design. Moreover, if the source follower 230 is omitted, a voltage dividing ratio of the voltage divider 220 can be increased.

Figure 3:
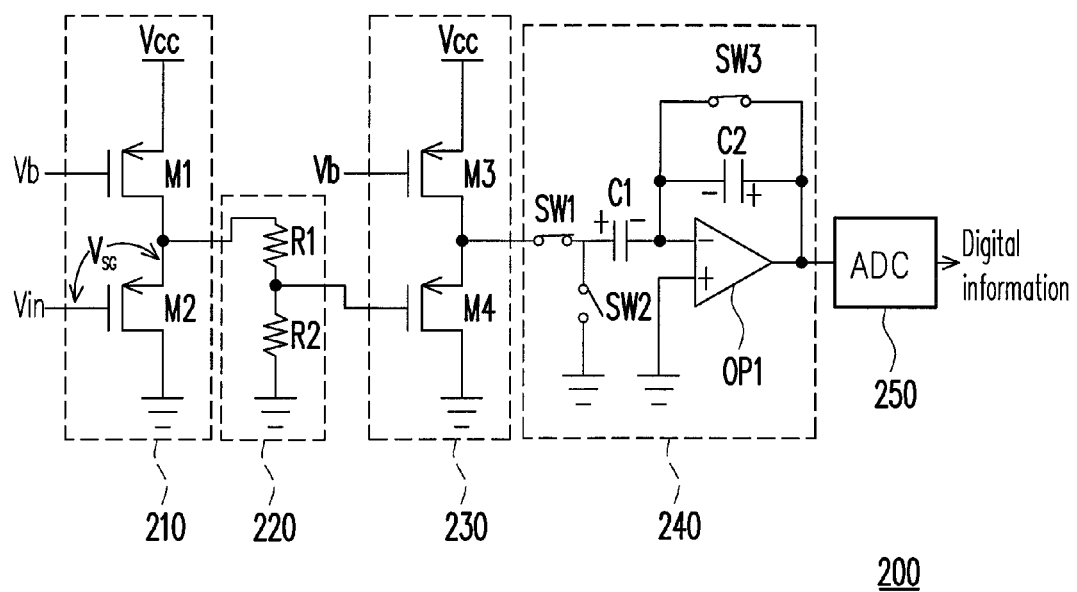
FIG. 3 is a circuit schematic diagram illustrating an analog-to-digital conversion circuit of FIG. 2.

FIG. 3 is a circuit schematic diagram illustrating the analog-to-digital conversion circuit of FIG. 2. Referring to FIG. 2 and FIG. 3, the source follower 210 includes transistors M1 and M2. A source of the transistor M1 is coupled to an operating voltage Vcc, a gate of the transistor M1 is coupled to a bias Vb, and a drain of the transistor M1 is coupled to a source of the transistor M2, wherein the operating voltage Vcc is, for example, 3.3V. A gate of the transistor M2 is coupled to the input voltage Vin, a drain of the transistor M2 is coupled to a ground voltage, wherein a voltage range of the input voltage Vin is, for example, 0-1.5V. The transistor M1 is conducted due to an influence of the bias Vb. A voltage difference between an output of the source follower 210 and the input voltage Vin is equal to a voltage $V_{SG}$ between the source and the gate of the transistor M2, wherein the voltage $V_{SG}$ is about 1V. Therefore, the output range of the source follower 210 is about 1-2.5V.

The voltage divider 220 includes resistors R1 and R2, wherein the resistor R1 is coupled between the source follower 210 and the source follower 230, and the resistor R2 is coupled between the source follower 230 and the ground voltage. Assuming an impedance ratio of the resistors R1 and R2 is 6:4, i.e. a voltage dividing ratio of the voltage divider 220 is 1:0.4, so that the output voltage range of the voltage divider 220 is about 0.4-1V. It should be noticed that the voltage dividing ratio of the voltage divider 220 can be changed according to an actual demand of the circuit design, which is not limited by the above embodiment.

The source follower 230 includes transistors M3 and M4. A source of the transistor M3 is coupled to the operating voltage Vcc, a gate of the transistor M3 is coupled to the bias Vb, and a drain of the transistor M3 is coupled to a source of the transistor M4. A gate of the transistor M4 is coupled to the voltage divider 220, and a drain of the transistor M4 is coupled to the ground voltage. Similarly, the transistor M3 is conducted due to an influence of the bias Vb. Moreover, a voltage difference between an output of the source follower 230 and the output of the voltage divider 220 is equal to a voltage $V_{SG}$ between the source and the gate of the transistor M4, wherein the voltage $V_{SG}$ is about 1V. Therefore, the output voltage range of the source follower 230 is about 1.4-2V.

The sample holder 240 includes switches SW1, SW2 and SW3, capacitors C1 and C2, and an operation amplifier OP1, wherein the switches SW1, SW2 and SW3 can be transistors, and an operating voltage of the sample holder 230 is, for example, 1.8V. According to a specification of the electronic device with the operating voltage of 1.8V, an upper limit of an input voltage that can be accepted by the electronic device is about 1.1 times the operating voltage, i.e. the input voltage that can be accepted by the switches SW1, SW2 and SW3 is about 0-1.98V (which is similar to 0-2V). Therefore, the sample holder 240 can totally accept the output voltage range of the source follower 230, so as to sample the voltage output by the source follower 230 and hold the sampled voltage.

Regarding an operation of the sample holder 240, an operation timing thereof is approximately divided into a sampling period (for example, a period that a clock signal has a high voltage level) and a holding period (for example, a period that the clock signal has a low voltage level). During the sampling period, the switches SW1 and SW3 are conducted, and the switch SW2 is not conducted, so that the output voltage of the source follower 230 can charge the capacitor C1. By such means, the sample holder 240 can sample the output voltage of the source follower 230.

During the holding period, the switch SW2 is conducted, and the switches SW1 and SW3 are not conducted. Now, positive charges of the capacitor C1 flow to the ground voltage through the switch SW2, and negative charges of the capacitor C1 cannot flow to the ground voltage through a negative input terminal of the operation amplifier OP1, but flow to the capacitor C2 through the negative input terminal of the operation amplifier OP1. By such means, the charges of the capacitor C1 are cleared. Meanwhile, the voltage of the capacitor C1 is transmitted to the capacitor C2, so that the voltage sampled by the capacitor C1 is stably output to the ADC 250 through the capacitor C2, wherein an operating voltage of the ADC 250 can be 1.8V. Since the operating voltage of the switches SW1, SW2 and SW3 is 1.8V, a switching speed of each of the switches SW1, SW2 and SW3 is faster than that of the electronic device with the operating voltage of 3.3V, so that the operation frequency of the sample holder 240 can be increased.

In summary, in the analog-to-digital conversion circuit of the present invention, the voltage range received by the sample holder is adjusted by the voltage divider, so that the first half and a second half of the sample holder can all use the electronic device with a low operating voltage. Since an operation speed of the electronic device with the low operating voltage is higher than that of the electronic device with a high operating voltage, the operation frequency of the sample holder can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An analog-to-digital conversion circuit, comprising:
   a first source follower, receiving an input voltage;
   a voltage divider, coupled to the first source follower;
   a second source follower, coupled to the voltage divider;
   a sample holder, coupled to the second source follower; and
   an analog-to-digital converter (ADC), coupled to the sample holder,
   wherein an operating voltage of the first source follower and the second source follower is a first voltage, and an operating voltage of the sample holder and the ADC is a second voltage, and the second voltage is less than the first voltage.

2. The analog-to-digital conversion circuit as claimed in claim 1, wherein the first source follower comprises:
   a first transistor, having a control terminal coupled to a bias, a first terminal coupled to the first voltage, and a second terminal coupled to the voltage divider; and
   a second transistor, having a control terminal coupled to the input voltage, a first terminal coupled to the second terminal of the first transistor, and a second terminal coupled to a ground voltage.

3. The analog-to-digital conversion circuit as claimed in claim 2, wherein the voltage divider comprises:
   a first resistor, coupled between the first source follower and the second source follower; and
   a second resistor, coupled between the second source follower and the ground voltage, and connected to the first resistor in serial.

4. The analog-to-digital conversion circuit as claimed in claim 3, wherein the second source follower comprises:
   a third transistor, having a control terminal coupled to the bias, a first terminal coupled to the first voltage, and a second terminal coupled to the sample holder; and
   a fourth transistor, having a control terminal coupled to the voltage divider, a first terminal coupled to the second terminal of the third transistor, and a second terminal coupled to the ground voltage.

5. The analog-to-digital conversion circuit as claimed in claim 4, wherein the sample holder comprises:
   an operation amplifier, having a positive input terminal coupled to the ground voltage;
   a first switch, having a first terminal coupled to the second source follower;
   a first capacitor, coupled between another terminal of the first switch and a negative input terminal of the operation amplifier;
   a second switch, coupled between another terminal of the first switch and the ground voltage;
   a second capacitor, coupled between the negative input terminal of the operation amplifier and an output terminal of the operation amplifier; and
   a third switch, coupled to the second capacitor in parallel,
   wherein during a first period, the first switch and the third switch are conducted, and the second switch is not conducted, and during a second period, the second switch is conducted, and the first switch and the third switch are not conducted.

6. The analog-to-digital conversion circuit as claimed in claim 5, wherein each of the first switch, the second switch and the third switch is a transistor.

7. The analog-to-digital conversion circuit as claimed in claim 1, wherein the first voltage is 3.3V, and the second voltage is 1.8V.

8. The analog-to-digital conversion circuit as claimed in claim 1, wherein the ADC is a pipelined ADC.

* * * * *